US012586704B2

(12) United States Patent
Fujieda

(10) Patent No.: US 12,586,704 B2
(45) Date of Patent: Mar. 24, 2026

(54) COIL ELEMENT, ANTENNA DEVICE, AND ELECTRONIC DEVICE

(71) Applicant: Murata Manufacturing Co., Ltd., Nagaokakyo (JP)

(72) Inventor: Shigeyuki Fujieda, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 125 days.

(21) Appl. No.: 18/438,830

(22) Filed: Feb. 12, 2024

(65) Prior Publication Data

US 2024/0186049 A1 Jun. 6, 2024

Related U.S. Application Data

(63) Continuation of application No. PCT/JP2022/028378, filed on Jul. 21, 2022.

(30) Foreign Application Priority Data

Aug. 30, 2021 (JP) ................................. 2021-139596

(51) Int. Cl.
| | |
|---|---|
| *H03H 7/01* | (2006.01) |
| *H01F 17/00* | (2006.01) |
| *H01F 27/29* | (2006.01) |
| *H01Q 5/50* | (2015.01) |
| *H03H 1/00* | (2006.01) |

(52) U.S. Cl.
CPC ....... *H01F 17/0013* (2013.01); *H01F 27/292* (2013.01); *H03H 7/0115* (2013.01); *H01Q 5/50* (2015.01); *H03H 2001/0085* (2013.01)

(58) Field of Classification Search
CPC .......... H03H 2001/0085; H03H 7/0115; H01F 17/0013
USPC .................................................. 333/175, 185
See application file for complete search history.

(56) References Cited

U.S. PATENT DOCUMENTS

| | | | | |
|---|---|---|---|---|
| 2006/0022770 A1* | 2/2006 | Asakawa | ............ | H01F 17/0013 333/175 |
| 2014/0049440 A1 | 2/2014 | Ueki et al. | | |
| 2015/0178434 A1 | 6/2015 | Ishizuka et al. | | |
| 2016/0248450 A1 | 8/2016 | Ishizuka | | |

(Continued)

FOREIGN PATENT DOCUMENTS

| | | |
|---|---|---|
| JP | 2021069132 A | 4/2021 |
| WO | 2012153690 A1 | 11/2012 |

(Continued)

OTHER PUBLICATIONS

International Search Report in PCT/JP2022/028378, mailed Sep. 20, 2022, 3 pages.

(Continued)

*Primary Examiner* — Rakesh B Patel
(74) *Attorney, Agent, or Firm* — Keating & Bennett, LLP

(57) ABSTRACT

A coil element includes a first coil and a second coil in an insulator. In the first coil, first conductor patterns are connected in parallel to each other, and a second conductor pattern is connected in series to the first conductor patterns. In the second coil, third conductor patterns are connected in parallel to each other, and a fourth conductor pattern is connected in series to the third conductor patterns. The second conductor pattern and the fourth conductor pattern face each other.

19 Claims, 7 Drawing Sheets

(56)                  References Cited

U.S. PATENT DOCUMENTS

2017/0117868  A1      4/2017  Ishizuka et al.
2019/0214727  A1      7/2019  Mikawa et al.
2021/0273334  A1*     9/2021  Tachibana ............ H04B 1/0064

FOREIGN PATENT DOCUMENTS

WO        2014050482  A1      4/2014
WO        2015068613  A1      5/2015
WO        2016114181  A1      7/2016
WO        2018101284  A1      6/2018
WO        2020217708  A1     10/2020

OTHER PUBLICATIONS

Written Opinion in PCT/JP2022/028378, mailed Sep. 20, 2022, 3
pages.

* cited by examiner

COIL ELEMENT, ANTENNA DEVICE, AND ELECTRONIC DEVICE

CROSS REFERENCE TO RELATED APPLICATIONS

This application claims the benefit of priority to Japanese Patent Application No. 2021-139596 filed on Aug. 30, 2021 and is a Continuation Application of PCT Application No. PCT/JP2022/028378 filed on Jul. 21, 2022. The entire contents of each application are hereby incorporated herein by reference.

BACKGROUND OF THE INVENTION

1. Field of the Invention

The present disclosure relates to coil elements, antenna devices, and electronic devices.

2. Description of the Related Art

Recently, an electronic device usable for communication has been able to be operated in a plurality of frequency bands. Thus, the electronic device includes an antenna device in which two antennas (radiating elements) are coupled to increase the range of usable frequency bands. For example, International Publication No. WO 2018/101284 discloses an antenna device in which two antennas of a power feed antenna and a parasitic antenna are coupled.

SUMMARY OF THE INVENTION

However, in a case where frequency bands to be used are high, each of the inductance and capacitance components of a coil element coupling two antennas of a feed antenna and a parasitic antenna needs to be reduced. Meanwhile, the coupling coefficient of a coil included in the coil element coupling the feed antenna and the parasitic antenna needs to be maintained high.

Thus, example embodiments of the present invention provide coil elements with reduced inductance and capacitance components and high coupling coefficients, and antenna devices and electronic devices including the coil elements.

A coil element according to an example embodiment of the present disclosure includes an insulator, a first outer electrode, a second outer electrode, a third outer electrode, and a fourth outer electrode on a surface of the insulator, and a first coil and a second coil each including a plurality of conductor patterns in the insulator. The first coil includes at least two layers of first conductor patterns electrically connected to the first outer electrode, and a second conductor pattern on the first conductor patterns and electrically connected to the second outer electrode. The layers of the first conductor patterns are connected in parallel to each other and the second conductor pattern is connected in series to the first conductor patterns. The second coil includes at least two layers of third conductor patterns electrically connected to the third outer electrode, and a fourth conductor pattern laminated on the third conductor patterns and electrically connected to the fourth outer electrode. The layers of the third conductor patterns are connected in parallel to each other and the fourth conductor pattern is connected in series to the third conductor patterns. The first coil and the second coil are positioned in the insulator such that the second conductor pattern and the fourth conductor pattern face each other in a lamination direction of the insulator. An opening of the first coil overlaps an opening of the second coil when viewed in the lamination direction of the insulator.

An antenna device according to an example embodiment of the present disclosure includes a first radiating element connected to a power supply circuit, a second radiating element, and the above-described coil element electrically connected to the first radiating element and the second radiating element. The first radiating element is electrically connected to the first coil of the coil element, and the second radiating element is electrically connected to the second coil of the coil element.

An electronic device according to an example embodiment of the present disclosure includes the above-described antenna device, the power supply circuit connected to the first radiating element, and a housing in which the antenna device and the power supply circuit are housed.

According to example embodiments of the present disclosure, coil elements have a configuration in which at least two layers of first conductor patterns connected in parallel are connected in series to a second conductor pattern, at least two layers of third conductor patterns connected in parallel are connected in series to a fourth conductor pattern, and a first coil and a second coil are positioned such that the second conductor pattern and the fourth conductor pattern face each other in a lamination direction. Thus, the inductance and capacitance components of the coil element are each reduced while the coupling coefficient is maintained high.

The above and other elements, features, steps, characteristics and advantages of the present invention will become more apparent from the following detailed description of the example embodiments with reference to the attached drawings.

BRIEF DESCRIPTION OF THE DRAWINGS

FIG. 4 is an equivalent circuit diagram of an antenna device according to an example embodiment of the present invention.

FIGS. 7A and 7B are diagrams for description of overlapping of conductor patterns in a coil element according to an example embodiment of the present invention.

DETAILED DESCRIPTION OF THE EXAMPLE EMBODIMENTS

Figure 1:
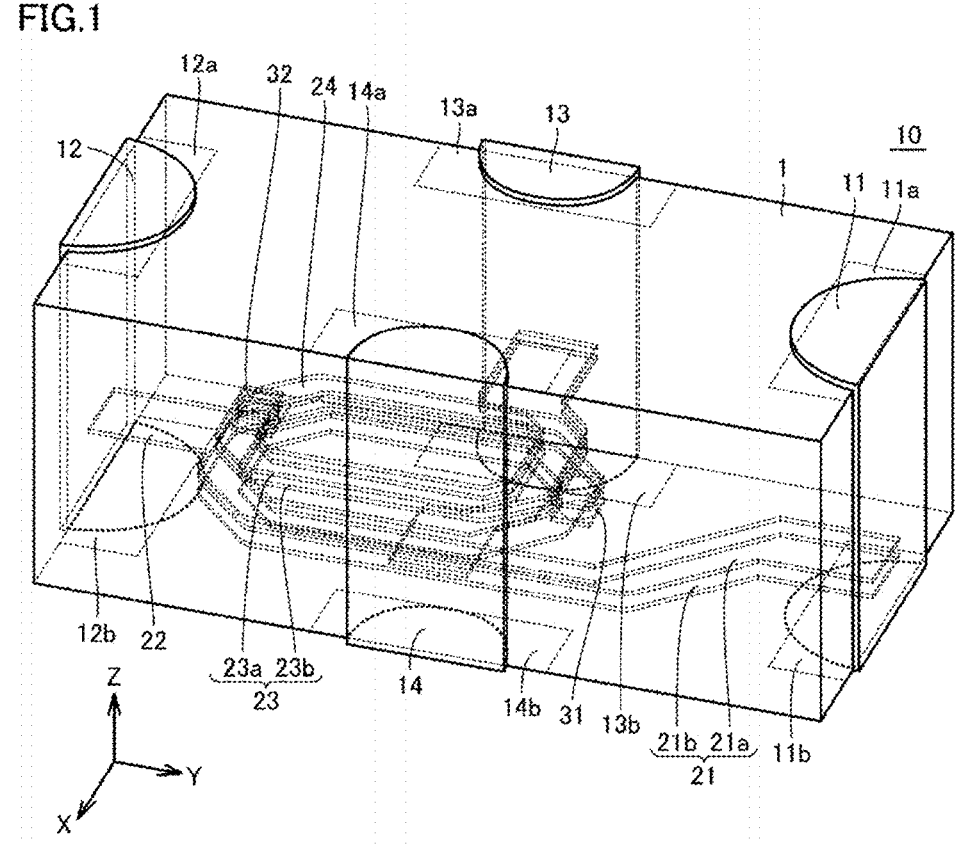
FIG. 1 is a perspective view of a coil element according to an example embodiment of the present invention.

Coil elements according to example embodiments and antenna devices and electronic devices that include the coil elements will be described below in detail with reference to the accompanying drawings. Any identical or equivalent portions in the drawings are denoted by the same reference sign, and duplicate description thereof is omitted.

Structure of Coil Element

Figures 2, 3:
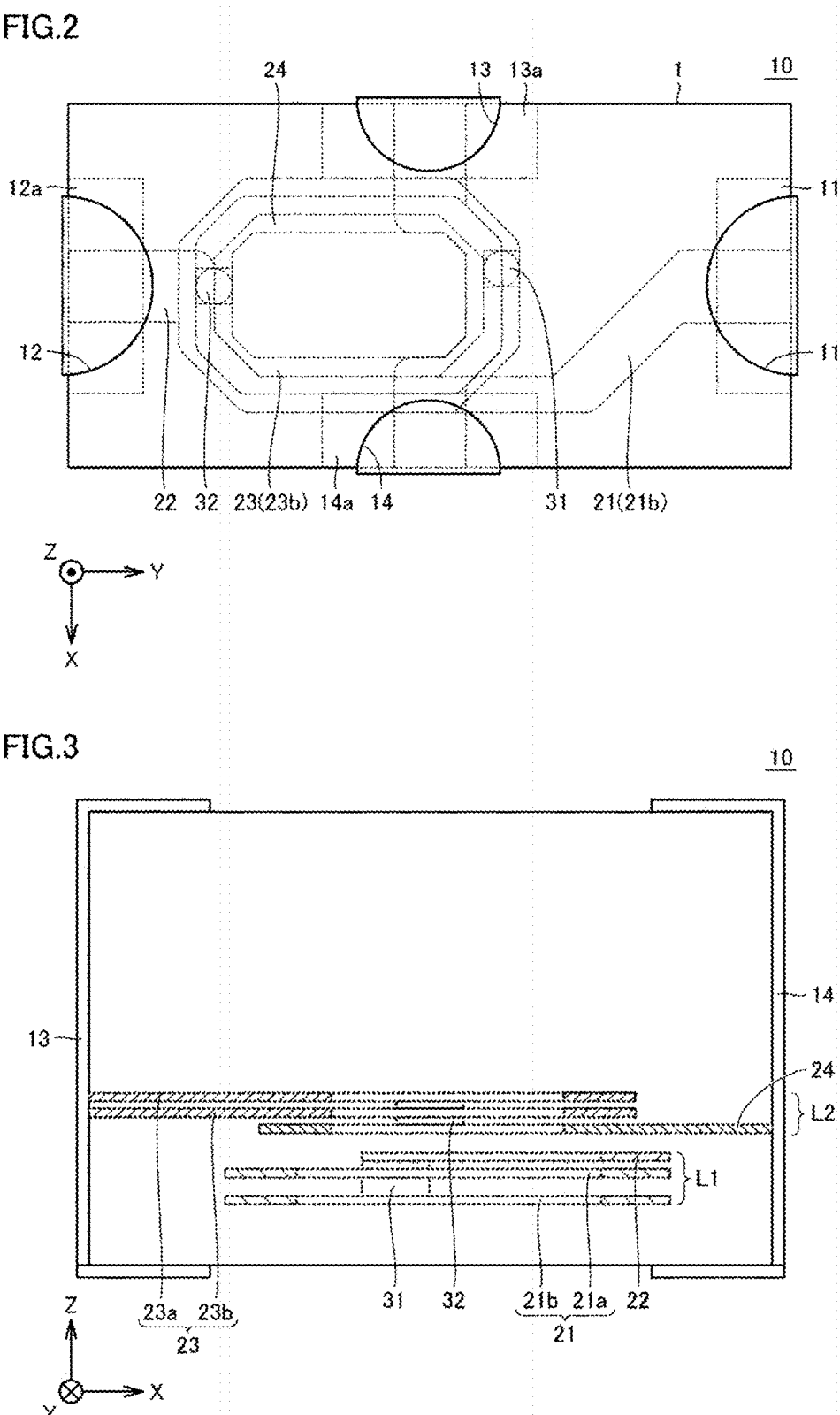
FIG. 2 is a plan view of a coil element according to an example embodiment of the present invention.
FIG. 3 is a side view of a coil element according to an example embodiment of the present invention.

First, a coil element according to an example embodiment will be described below with reference to the accompanying drawings. FIG. 1 is a perspective view of a coil element 10 according to the present example embodiment. FIG. 2 is a plan view of the coil element 10 according to the present example embodiment. FIG. 3 is a side view of the coil element 10 according to the present example embodiment. In FIGS. 1 to 3, the short-side direction, long-side direction, and height direction of the coil element 10 are referred to as an X direction, a Y direction, and a Z direction, respectively. The Z direction is the substrate lamination direction, and the orientation of the corresponding arrow indicates an upper layer side.

The coil element 10 is an antenna coupling element that couples two antennas (radiating elements), and is a chip component preferably with a rectangular or substantially rectangular parallelepiped shape. As illustrated in FIG. 1, a first outer electrode 11, a second outer electrode 12, a third outer electrode 13, and a fourth outer electrode 14 are provided on an outer surface of the coil element 10. The coil element 10 includes a pair of principal surfaces facing each other, and a principal surface on the lower side in FIG. 1 is a mounting surface and faces a circuit board.

The coil element 10 includes two coils L1 and L2 to magnetically couple two antennas (radiating elements), and the coils L1 and L2 define a transformer by being magnetically coupled.

A specific configuration of the coil element 10 will be described below. As illustrated in FIGS. 1 to 3, the coil element 10 includes an insulator 1 (ceramic element body) of a ceramic layer obtained by laminating a plurality of substrates (ceramic green sheets) on which coil wires are formed. The insulator 1 includes a pair of principal surfaces facing each other and side surfaces connecting the principal surfaces. A plurality of first conductor patterns 21, a second conductor pattern 22, a plurality of third conductor patterns 23, and a fourth conductor pattern 24 are laminated parallel to the principal surfaces of the insulator 1, and accordingly, the coil element 10 including the coils L1 and L2 is provided.

In the coil L1, two layers of first conductor patterns 21a and 21b and one layer of the second conductor pattern 22 are laminated and electrically connected to one another through a via conductor 31. Specifically, in the coil L1, the two layers of the first conductor patterns 21 as the first conductor patterns 21a and 21b are connected in parallel to each other through the via conductor 31 and connected in series to the second conductor pattern 22 through the via conductor 31. Accordingly, the inductance component of the coil L1 is reduced as compared to a case where the first conductor pattern 21a and the second conductor pattern 22 are connected in series to each other. The first conductor patterns 21 may include two or more layers of conductor patterns.

In the coil L2, two layers of third conductor patterns 23a and 23b and one layer of the fourth conductor pattern 24 are laminated and electrically connected to one another through a via conductor 32. Specifically, in the coil L2, the two layers of the third conductor patterns 23 as the third conductor patterns 23a and 23b are connected in parallel to each other through the via conductor 32 and connected in series to the fourth conductor pattern 24 through the via conductor 32. Accordingly, the inductance component of the coil L2 is reduced as compared to a case where the third conductor pattern 23a and the fourth conductor pattern 24 are connected in series to each other. The third conductor patterns 23 may include two or more layers of conductor patterns.

The coils L1 and L2 are positioned in the insulator 1 such that the opening of the coil L1 overlaps the opening of the coil L2 when viewed in the lamination direction of the insulator 1. As illustrated in FIG. 2 when viewed in the lamination direction of the insulator 1, the coils L1 and L2 are positioned such that the openings of the coils L1 and L2 are shifted from the center of the coil element 10 in the long-side direction and are closer, in the long-side direction, to the second outer electrode 12 provided on a short side of the coil element 10. However, the positions of the coils L1 and L2 illustrated in FIG. 2 is exemplary and may be other positions. Specifically, the coils L1 and L2 are positioned in the insulator 1 such that the second conductor pattern 22 and the fourth conductor pattern 24 face each other. Since the coils L1 and L2 have the configuration in which one layer of the second conductor pattern 22 and one layer of the fourth conductor pattern 24 face each other with an insulating layer interposed therebetween, the capacitance component of the configuration is smaller than that of a configuration in which three layers of conductor patterns face each other with an insulating layer interposed therebetween.

In a case where the coils L1 and L2 are positioned such that the second conductor pattern 22 and the fourth conductor pattern 24 face each other, the coupling coefficient of the coils L1 and L2 can be maintained higher than in a case where the coils L1 and L2 are positioned such that the two layers of the first conductor patterns 21 and the two layers of the third conductor patterns 23 face each other. Thus, in the coil element 10, mutual inductance M of the coils L1 and L2 does not decrease since the coils L1 and L2 are positioned such that the second conductor pattern 22 and the fourth conductor pattern 24 face each other.

As illustrated in FIG. 1, the first outer electrode 11 is provided on one short side, the second outer electrode 12 is provided on the other short side, the third outer electrode 13 is provided on one long side, and the fourth outer electrode 14 is provided on the other long side among the side surfaces of the insulator 1.

Each of the plurality of first conductor patterns 21 is electrically connected to the first outer electrode 11. Among the plurality of first conductor patterns 21, only the first conductor pattern 21b on the lower side may be electrically connected to the first outer electrode 11, and the first conductor pattern 21a on the upper side may be electrically connected to the first conductor pattern 21b through a via conductor. The second conductor pattern 22 is electrically connected to the second outer electrode 12.

Each of the plurality of third conductor patterns 23 is electrically connected to the third outer electrode 13. Among the plurality of third conductor patterns 23, only the third conductor pattern 23b on the lower side may be electrically connected to the third outer electrode 13, and the third conductor pattern 23a on the upper side may be electrically connected to the third conductor pattern 23b through a via conductor. The fourth conductor pattern 24 is electrically connected to the fourth outer electrode 14.

Configuration of Antenna Device

Figure 4:
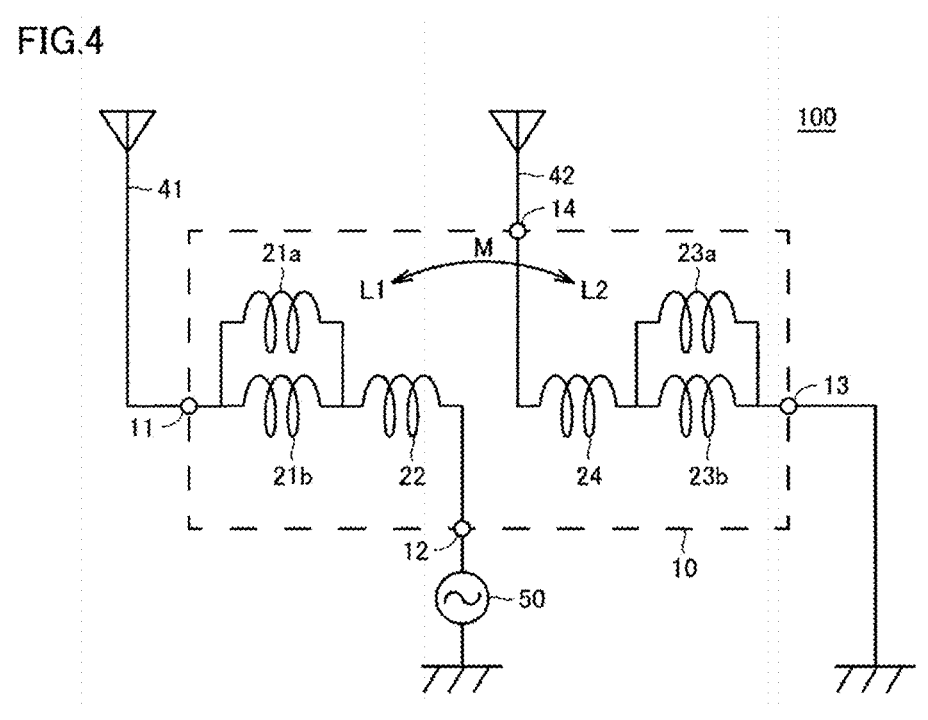

The configuration of an antenna device including the coil element 10 as an antenna coupling element that couples two antennas (radiating elements) will be described below. FIG. 4 is an equivalent circuit diagram of an antenna device 100 according to the present example embodiment. In the antenna device 100, a first antenna 41 that is a feed antenna connected to a power supply circuit 50, and a second antenna 42 that is a parasitic antenna not supplied with power from the power supply circuit 50 are coupled to each other by using the coil element 10.

Specifically, the first antenna 41 is electrically connected to the first outer electrode 11 of the coil element 10, and the power supply circuit 50 is electrically connected to the second outer electrode 12 of the coil element 10. In other words, the coil L1 of the coil element 10 is connected between the first antenna 41 and the power supply circuit 50.

As illustrated in FIG. 4, in the coil L1, a coil portion including the first conductor pattern 21*a* and a coil portion including the first conductor pattern 21*b* are connected in parallel to each other and connected in series to a coil portion including the second conductor pattern 22. In the coil L1, the coil portion including the second conductor pattern 22 is connected to the power supply circuit 50.

The second antenna 42 is electrically connected to the fourth outer electrode 14 of the coil element 10, and the third outer electrode 13 of the coil element 10 is connected to GND (grounded). In other words, the coil L2 of the coil element 10 is connected between the second antenna 42 and GND.

As illustrated in FIG. 4, in the coil L2, a coil portion including the third conductor pattern 23*a* and a coil portion including the third conductor pattern 23*b* are connected in parallel to each other and connected in series to a coil portion including the fourth conductor pattern 24. In the coil L2, the coil portion including the third conductor pattern 23*a* and the coil portion including the third conductor pattern 23*b*, which are connected in parallel to each other, are connected to GND. A larger amount of current flows on the GND side than on the second antenna 42 side, and thus the Q value of the coil L2 can be improved by positioning the coil portions connected in parallel on the GND side. The coil portions connected in parallel can be positioned on the GND side by using the third outer electrode 13 of the coil element 10 as a GND electrode (ground electrode).

In the antenna device 100, the range of frequency bands usable with the first antenna 41 and the second antenna 42 can be increased by magnetically coupling the coils L1 and L2 as illustrated in FIG. 4. The mutual inductance M is generated between the coils L1 and L2.

Exploded Plan View of Coil Element

The configuration of each layer will be described below with reference to exploded plan views. FIGS. 5 and 6 are exploded plan views illustrating the configuration of the coil element according to the present example embodiment. First, the first conductor patterns 21 to the fourth conductor pattern 24 are formed by applying a conductive paste (Ni paste) onto ceramic green sheets 1*a* to 1*o* as substrates by a screen printing method as illustrated in FIGS. 5 and 6.

Figures 5A, 5B, 5C, 5D, 5E, 5F, 5G, 5H:
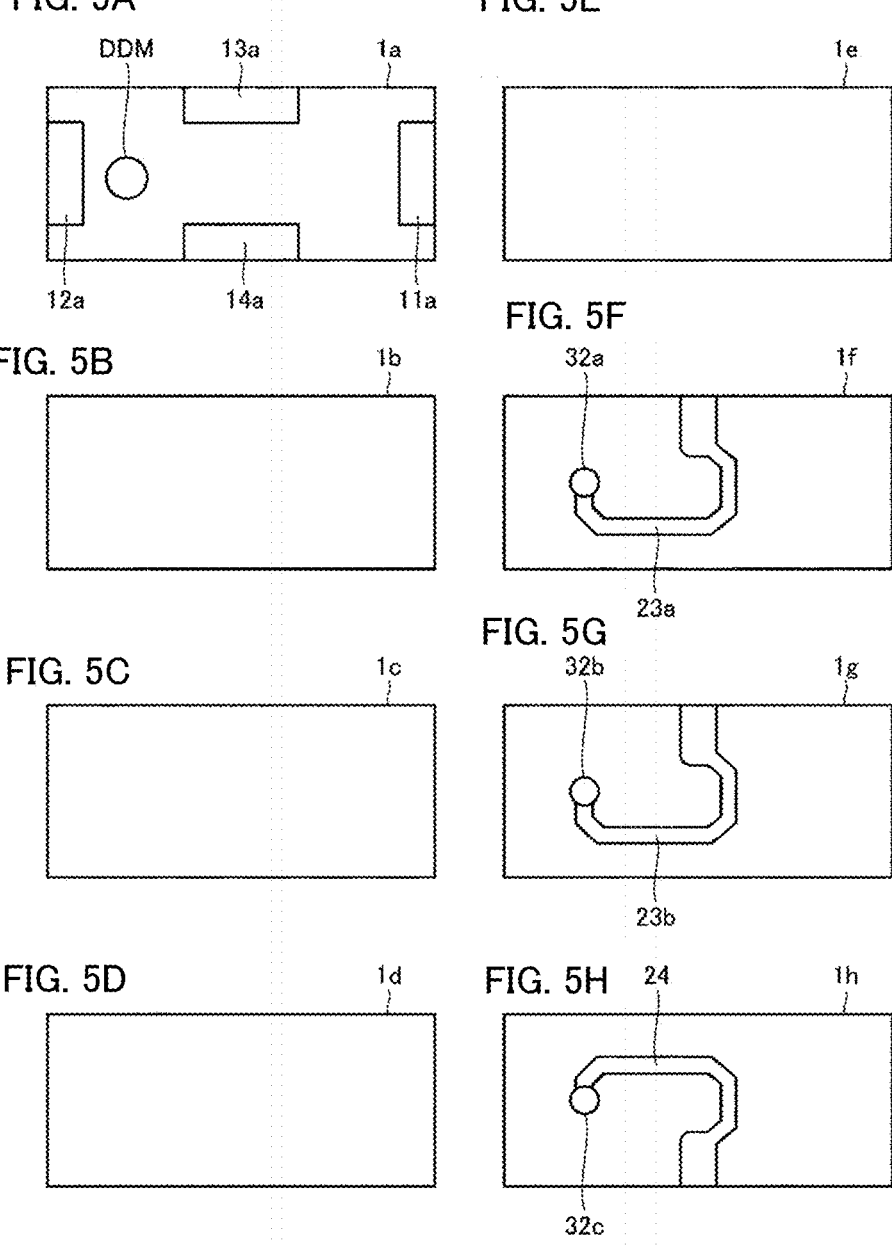
FIGS. 5A to 5H are exploded plan views illustrating a configuration of a coil element according to an example embodiment of the present invention.

On the ceramic green sheet 1*a*, conductor patterns 11*a* to 14*a* are formed at positions corresponding to the first outer electrode 11 to the fourth outer electrode 14 as illustrated in FIG. 5A. The ceramic green sheet 1*a* is provided with a direction identification mark DDM indicating that the ceramic green sheet 1*a* is a top surface on a side opposite a mounting surface. The direction identification mark DDM is used to detect the orientation of the coil element 10 as a chip component, for example, when the chip component is mounted on the circuit board by a mounting machine.

As illustrated in FIGS. 5B to 5E, no conductor patterns are formed on the ceramic green sheets 1*b* to 1*e*. Accordingly, in the coil element 10, the first conductor patterns 21 to the fourth conductor pattern 24 are formed on the lower side (side to be mounted on the circuit board) as illustrated in FIG. 3.

With reference to FIGS. 5A to 5H, as illustrated in FIG. 5F, the third conductor pattern 23*a* is formed on the ceramic green sheet 1*f*. The third conductor pattern 23*a* is formed in approximately a ½ to ¾ circle in the clockwise direction from the middle of the long side of the ceramic green sheet 1*f* on the upper side in the drawing. The third conductor pattern 23*a* includes a start end at an outer peripheral portion of the ceramic green sheet 1*f* so that the conductor pattern can be electrically connected to the third outer electrode 13. The third conductor pattern 23*a* includes a terminal end provided with a connection portion 32*a* to be connected to the via conductor 32.

As illustrated in FIG. 5G, the third conductor pattern 23*b* is formed on the ceramic green sheet 1*g*. The third conductor pattern 23*b* is formed in approximately a ½ to ¾ circle in the clockwise direction from the middle of the long side of the ceramic green sheet 1*g* on the upper side in the drawing. The third conductor pattern 23*b* includes a start end at an outer peripheral portion of the ceramic green sheet 1*g* so that the conductor pattern can be electrically connected to the third outer electrode 13. The third conductor pattern 23*b* includes a terminal end provided with a connection portion 32*b* to be connected to the via conductor 32.

As illustrated in FIG. 5H, the fourth conductor pattern 24 is formed on the ceramic green sheet 1*h*. The fourth conductor pattern 24 is formed in approximately a ½ to ¾ circle in the counterclockwise direction from the middle of the long side of the ceramic green sheet 1*h* on the lower side in the drawing. The fourth conductor pattern 24 includes a start end at an outer peripheral portion of the ceramic green sheet 1*h* so that the conductor pattern can be electrically connected to the fourth outer electrode 14. The fourth conductor pattern 24 includes a terminal end provided with a connection portion 32*c* to be connected to the via conductor 32.

Figures 6I, 6J, 6K, 6L, 6M, 6N, 6O:
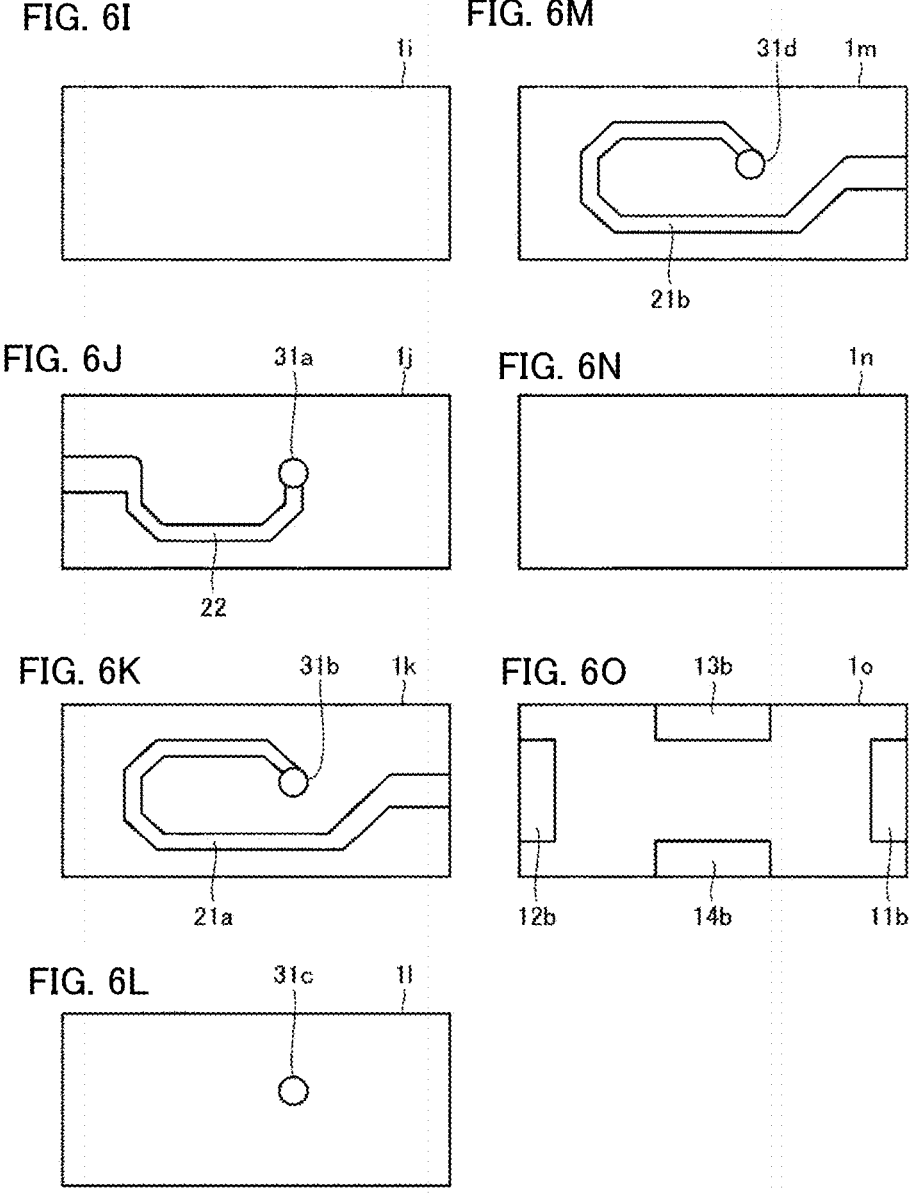
FIGS. 6I to 6O are exploded plan views illustrating a configuration of a coil element according to an example embodiment of the present invention.

As illustrated in FIG. 6I, no conductor patterns are formed on the ceramic green sheet 1*i*. Accordingly, in the coil element 10, the interlayer distance between the fourth conductor pattern 24 and the second conductor pattern 22 is longer than the interlayer distance between the third conductor pattern 23*a* and the third conductor pattern 23*b* or the interlayer distance between the third conductor pattern 23*b* and the fourth conductor pattern 24 as illustrated in FIG. 3. Thus, the coupling degree of the coils L1 and L2 in the coil element 10 can be adjusted by adjusting the interlayer distance between the fourth conductor pattern 24 and the second conductor pattern 22.

With reference to FIGS. 6I to 6L, as illustrated in FIG. 6J, the second conductor pattern 22 is formed on the ceramic green sheet 1*j*. The second conductor pattern 22 is formed in approximately a ½ circle in the counterclockwise direction from the middle of the short side of the ceramic green sheet 1*j* on the left side in the drawing. The second conductor pattern 22 includes a start end at an outer peripheral portion of the ceramic green sheet 1*j* so that the conductor pattern can be electrically connected to the second outer electrode 12. The second conductor pattern 22 includes a terminal end provided with a connection portion 31*a* to be connected to the via conductor 31.

As illustrated in FIG. 6K, the first conductor pattern 21*a* is formed on the ceramic green sheet 1*k*. The first conductor pattern 21*a* is formed in approximately a ¾ to 1 circle in the clockwise direction from the middle of the short side of the ceramic green sheet 1*k* on the right side in the drawing. The first conductor pattern 21*a* includes a start end at an outer peripheral portion of the ceramic green sheet $1k$ so that the conductor pattern can be electrically connected to the first outer electrode 11. The first conductor pattern 21$a$ includes a terminal end provided with a connection portion 31$b$ to be connected to the via conductor 31.

As illustrated in FIG. 6L, only a connection portion 31$c$ to be connected to the via conductor 31 is provided on the ceramic green sheet 1 and no conductor patterns are formed thereon. Accordingly, in the coil element 10, the interlayer distance between the first conductor patterns 21$a$ and 21$b$ is longer than the interlayer distance between the third conductor pattern 23$a$ and the third conductor pattern 23$b$ or the interlayer distance between the first conductor pattern 21$b$ and the second conductor pattern 22 as illustrated in FIG. 3. The first conductor pattern 21$b$ is a first conductor pattern, among the plurality of first conductor patterns 21, facing the second conductor pattern 22. Thus, the inductance component of the coil L1 in the coil element 10 can be adjusted by adjusting the interlayer distance between the first conductor patterns 21$a$ and 21$b$.

With reference to FIGS. 6I to 6L, as illustrated in FIG. 6M, the first conductor pattern 21$b$ is formed on the ceramic green sheet $1m$. The first conductor pattern 21$b$ is formed in approximately a ¾ to 1 circle in the clockwise direction from the middle of the short side of the ceramic green sheet $1m$ on the right side in the drawing. The first conductor pattern 21$b$ includes a start end at an outer peripheral portion of the ceramic green sheet $1m$ so that the conductor pattern can be electrically connected to the first outer electrode 11. The first conductor pattern 21$b$ includes a terminal end provided with a connection portion 31$d$ to be connected to the via conductor 31.

As illustrated in FIG. 6N, no conductor patterns are formed on the ceramic green sheet $1n$. In addition, as illustrated in FIG. 6O, conductor patterns 11$b$ to 14$b$ are formed on the ceramic green sheet $1o$ at positions corresponding to the first outer electrode 11 to the fourth outer electrode 14.

The substrates of the insulator 1 are ceramic green sheets in the above description, but the insulator 1 may be a non-magnetic ceramic insulator made of low temperature co-fired ceramics (LTCC) or the like, or may be a resin insulator made of a resin material such as polyimide or liquid crystal polymer. In this manner, since non-magnetic bodies are used (magnetic ferrite is not used) as the substrates of the insulator 1, the coil element 10 functions as an antenna coupling element even in a high frequency band exceeding several hundreds MHz.

Each conductor pattern and each via conductor are made of a conductor material including Ag or Cu as a main component and having a small specific resistance. In a case where the substrates of the insulator 1 are made of ceramic, each conductor pattern and each via conductor are formed by, for example, screen printing and firing with a conductive paste containing Ag or Cu as a main component. In a case where the substrates of the insulator 1 is made of resin, each conductor pattern and each via conductor are formed by, for example, patterning metal foil such as Al foil or Cu foil by etching or the like.

Overlapping of Conductor Patterns

Overlapping of a conductor pattern and an outer electrode and overlapping of conductor patterns will be described below. As understood from the plan view of the coil element 10 illustrated in FIG. 2, the first conductor patterns 21 do not overlap the third outer electrode 13 as a GND electrode when the coil element 10 is viewed in the lamination direction of the insulator 1. Accordingly, the coil L1 has no overlapping portion with GND electrode when viewed in the lamination direction of the insulator 1, and thus no excessive capacitance component is generated at the coil L1.

Figures 7A, 7B:
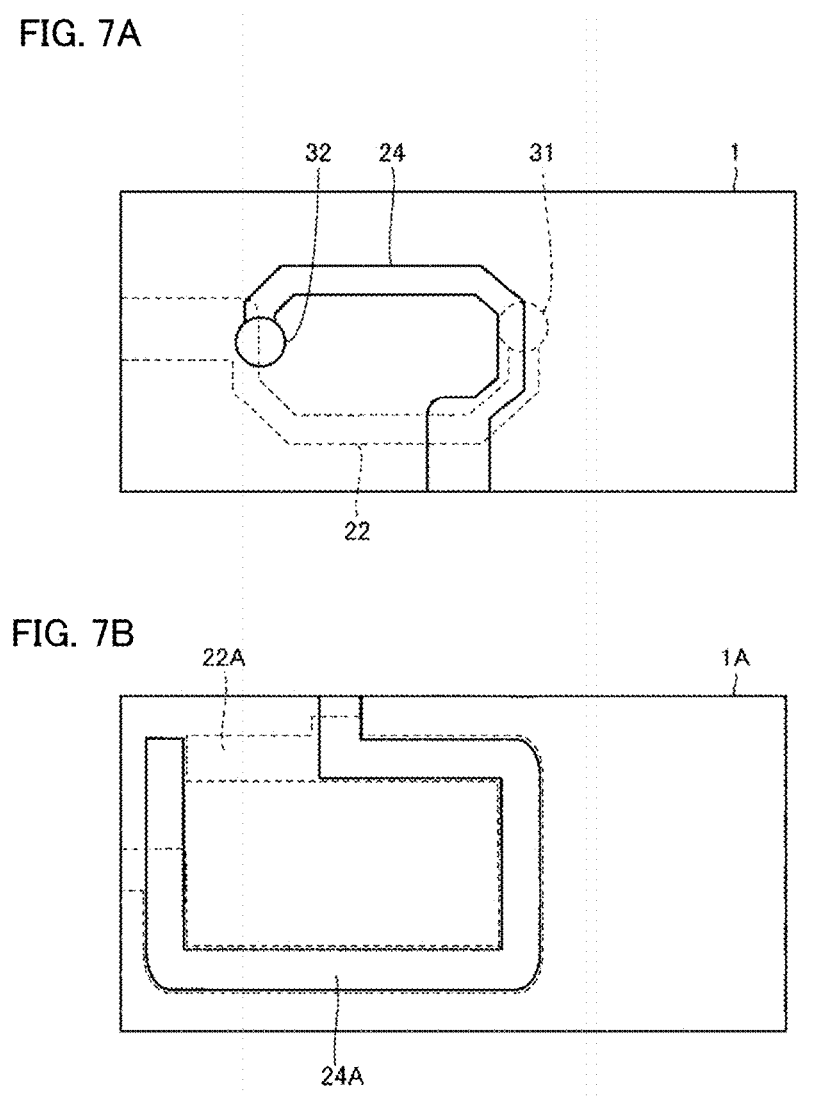

In the coil element 10, the area of a portion where the second conductor pattern 22 overlaps the fourth conductor pattern 24 is equal to or smaller than about 80%, preferably equal to or smaller than about 50% of the area of a portion where at least one of the second conductor pattern 22 and the fourth conductor pattern 24 exists when viewed in the lamination direction of the insulator 1. FIGS. 7A and 7B are diagrams for description of overlapping of conductor patterns in the coil element according to the present example embodiment. FIG. 7A is a diagram illustrating a state in which the second conductor pattern 22 (dashed line) in FIG. 6J is placed under the fourth conductor pattern 24 (solid line) in FIG. 5H.

In FIG. 7A, the area of a portion (AND portion) where the fourth conductor pattern 24 (solid line) overlaps the second conductor pattern 22 (dashed line) is equal to or smaller than about 50% of the area of a portion (OR portion) where at least one of the fourth conductor pattern 24 and the second conductor pattern 22 exists when viewed in the lamination direction of the insulator 1. Accordingly, in the coil element 10, the capacitance component generated due to overlapping of the fourth conductor pattern 24 and the second conductor pattern 22 is reduced.

FIG. 7B is a diagram illustrating a state in which another second conductor pattern 22A (dashed line) is placed under another fourth conductor pattern 24A (solid line). In FIG. 7B, the area of a portion (AND portion) where the fourth conductor pattern 24A (solid line) overlaps the second conductor pattern 22A (dashed line) is equal to or smaller than about 80% of the area of a portion (OR portion) where at least one of the fourth conductor pattern 24A and the second conductor pattern 22A exists when viewed in the lamination direction of the insulator 1. Accordingly, in the coil element, the capacitance component generated due to overlapping of the fourth conductor pattern 24A and the second conductor pattern 22A is reduced as compared to a case where the fourth conductor pattern 24A and the second conductor pattern 22A have the same shape and the fourth conductor pattern 24A substantially overlaps the second conductor pattern 22A.

Configuration of Electronic Device

Figures 8, 9:
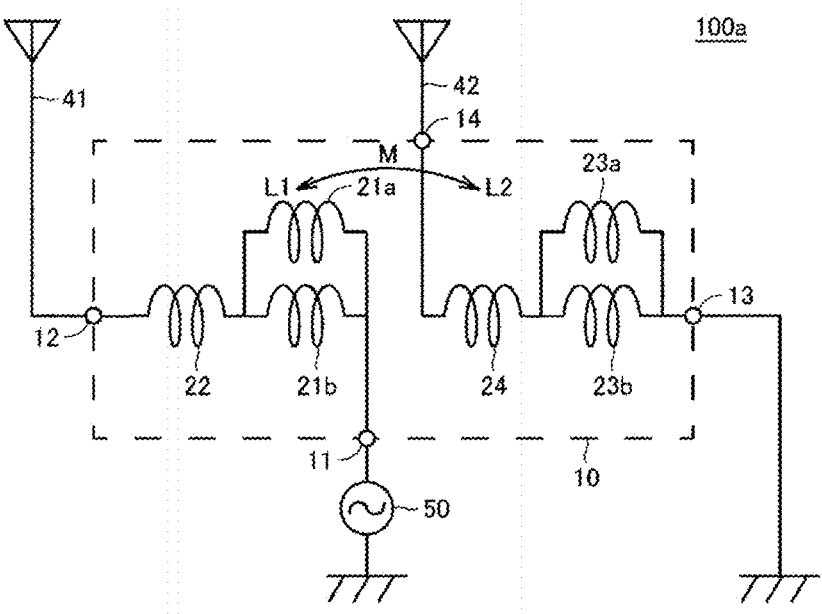
FIG. 8 is a schematic diagram of an electronic device according to an example embodiment of the present invention.
FIG. 9 is an equivalent circuit diagram of an antenna device according to a modification of an example embodiment of the present invention.

An electronic device including the antenna device 100 will be described below. FIG. 8 is a schematic view illustrating an electronic device 200 according to the present example embodiment. The electronic device 200 illustrated in FIG. 8 is a portable terminal that can perform communication in, for example, a band including n78 (about 3.3 GHZ to about 3.8 GHZ) and a band including n79 (about 4.4 GHz to about 4.9 GHZ). Thus, the electronic device 200 is provided with the antenna device 100 including the first antenna 41 that is excited in the band including n78 and the second antenna 42 that is excited in the band including n79. The electronic device 200 has a housing 60 in which the antenna device 100 and the power supply circuit 50 are housed. The electronic device 200 is, for example, a cellular phone, a smartphone, or a tablet.

In the antenna device 100, the coil element 10 is mounted on the back side of a circuit board 70 on which the first antenna 41 and the second antenna 42 are patterned, and couples the first antenna 41 and the second antenna 42. The first antenna 41 is electrically connected to the power supply circuit 50 through a wire not illustrated. Accordingly, the first antenna 41 is a feed antenna. However, the second antenna 42 is not electrically connected to the power supply circuit 50. Accordingly, the second antenna 42 is a parasitic antenna.

As illustrated in FIG. 8, the first antenna 41 include a linear conductor pattern extending from the coil element 10 in the left direction in the drawing. The second antenna 42 includes a linear conductor pattern extending from the coil element 10 in the right direction in the drawing and bending at a halfway point in the left direction in the drawing. The first antenna 41 and the second antenna 42 each define and function as a monopole antenna.

As described above, the coil element 10 according to the example embodiment includes the insulator 1 including a plurality of insulating layers, the first outer electrode 11, the second outer electrode 12, the third outer electrode 13, and the fourth outer electrode 14 on the surface of the insulator 1, and the coil L1 (first coil) and the coil L2 (second coil) including a plurality of conductor patterns in the insulator 1. The coil L1 includes at least two layers of the first conductor patterns 21 electrically connected to the first outer electrode 11 and the second conductor pattern 22 laminated on the first conductor patterns 21 and electrically connected to the second outer electrode 12, the layers of the first conductor patterns 21 are connected in parallel to each other, and the second conductor pattern 22 is connected in series to the first conductor patterns 21. The coil L2 includes at least two layers of the third conductor patterns 23 electrically connected to the third outer electrode 13 and the fourth conductor pattern 24 laminated on the third conductor patterns 23 and electrically connected to the fourth outer electrode 14, the layers of the third conductor patterns 23 are connected in parallel to each other, and the fourth conductor pattern 24 is connected in series to the third conductor patterns 23. The coils L1 and L2 are positioned in the insulator 1 such that the second conductor pattern 22 and the fourth conductor pattern 24 face each other in the lamination direction, and the opening of the coil L1 overlaps opening of the coil L2 when viewed in the lamination direction of the insulator 1.

With this configuration, in the coil element 10 according to the present example embodiment, the second conductor pattern 22 is connected in series to the first conductor patterns 21 connected in parallel to each other, the fourth conductor pattern 24 is connected in series to the third conductor patterns 23 connected in parallel to each other, and the coils L1 and L2 are positioned such that the second conductor pattern 22 and the fourth conductor pattern 24 face each other in the lamination direction, and thus the inductance and capacitance components are each reduced while the coupling coefficient is maintained high.

The area of the portion where the second conductor pattern 22 overlaps the fourth conductor pattern 24 is preferably equal to or smaller than about 80% of the area of the portion where at least one of the second conductor pattern 22 and the fourth conductor pattern 24 exists when viewed in the lamination direction of the insulator 1. Accordingly, the capacitance component generated at the coils L1 and L2 is reduced in the coil element 10.

The area of the portion where the second conductor pattern 22 overlaps the fourth conductor pattern 24 is more preferably equal to or smaller than about 50% of the area of the portion where at least one of the second conductor pattern 22 and the fourth conductor pattern 24 exists when viewed in the lamination direction of the insulator 1. Accordingly, the capacitance component generated at the coils L1 and L2 is further reduced in the coil element 10.

The third outer electrode 13 is preferably a GND electrode. Accordingly, the coil portions connected in parallel are positioned on the GND side, and thus the Q value of the coil L2 is improved.

The third outer electrode 13 preferably does not overlap the plurality of first conductor patterns 21 when viewed in the lamination direction of the insulator 1. Accordingly, the coil L1 has no overlapping portion with GND electrode when viewed in the lamination direction of the insulator 1, and thus no excessive capacitance component is generated at the coil L1.

The interlayer distance e between the first conductor patterns 21 adjacent to each other is preferably longer than the interlayer distance between the third conductor patterns 23 adjacent to each other. Accordingly, for example, the inductance component of the coil L1 in the coil element 10 can be adjusted by adjusting the interlayer distance between the first conductor patterns 21a and 21b.

The interlayer distance between the first conductor patterns 21 adjacent to each other is longer than the interlayer distance between the second conductor pattern 22 and the first conductor pattern 21 closest to the second conductor pattern 22. Accordingly, for example, the inductance component of the coil L1 in the coil element 10 can be adjusted by adjusting the interlayer distance between the first conductor patterns 21a and 21b.

It is preferable that the layers of the first conductor patterns 21 are electrically connected to the first outer electrode 11 and the layers of the third conductor patterns 23 are electrically connected to the third outer electrode 13. Accordingly, without providing via conductors, the layers of the first conductor patterns 21 can be connected to the first outer electrode 11, and the layers of the third conductor patterns 23 can be connected to the third outer electrode 13.

The antenna device 100 according to the present example embodiment includes the first antenna 41 (first radiating element) that is a feed antenna connected to the power supply circuit 50, the second antenna 42 (second radiating element) that is a parasitic antenna, and the above-described coil element 10 electrically connected to the first antenna 41 and the second antenna 42. The first antenna 41 is electrically connected to the coil L1 of the coil element 10, and the second antenna 42 is electrically connected to the coil L2 of the coil element 10.

The second outer electrode 12 preferably is connected to the power supply circuit 50. The coil element 10 is designed such that the coil openings are positioned closer to the second outer electrode 12 with respect to the center of the element. Accordingly, the current value at the second conductor pattern 22 facing the fourth conductor pattern 24 is increased and coupling between the coils L1 and L2 is increased.

Accordingly, the antenna device 100 according to the present example embodiment can be used for high frequency bands since the antenna device 100 includes the coil element 10 the inductance and capacitance components of which are each reduced while the coupling coefficient is maintained high.

It is preferable that the first antenna 41 is electrically connected to the first outer electrode 11 of the coil element 10, the power supply circuit 50 is electrically connected to the second outer electrode 12 of the coil element 10, the second antenna 42 is electrically connected to the fourth outer electrode 14 of the coil element 10, and the third outer electrode 13 of the coil element is connected to GND.

Accordingly, the coil portions connected in parallel are positioned on the GND side, and thus the Q value of the coil L2 is improved.

The electronic device 200 according to the present example embodiment includes the above-described antenna device 100, the power supply circuit 50 connected to the first antenna 41, and the housing 60 in which the antenna device 100 and the power supply circuit 50 are housed.

Accordingly, the electronic device 200 according to the present example embodiment can perform communication in high frequency bands since the electronic device 200 includes the antenna device 100 including the coil element 10 the inductance and capacitance components of which are each reduced while the coupling coefficient is maintained high.

Modification

In the antenna device 100 described above, the first antenna 41 is electrically connected to the first outer electrode 11 of the coil element 10 and the power supply circuit 50 is electrically connected to the second outer electrode 12 of the coil element 10 as illustrated in FIG. 4. However, the configuration is not limited thereto, but the first antenna 41 may be electrically connected to the second outer electrode 12 of the coil element 10 and the power supply circuit 50 may be electrically connected to the first outer electrode 11 of the coil element 10.

FIG. 9 is an equivalent circuit diagram of an antenna device according to a modification of an example embodiment of the present invention. In an antenna device 100a illustrated in FIG. 9, the same components as in the antenna device 100 illustrated in FIG. 4 are denoted by the same reference signs and detailed description thereof is omitted. In the antenna device 100a, the first antenna 41 is electrically connected to the second outer electrode 12 of the coil element 10, the power supply circuit 50 is electrically connected to the first outer electrode 11 of the coil element 10, the second antenna 42 is electrically connected to the fourth outer electrode 14 of the coil element 10, and the third outer electrode 13 of the coil element 10 is connected to GND. In the antenna device 100a, a larger amount of current flows on the power supply circuit 50 side than on the first antenna 41 side, and thus the inductance component of the coil L1 can be easily adjusted by selecting one of the sides to which the coil portions connected in parallel are connected.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A coil element comprising:
an insulator;
a first outer electrode, a second outer electrode, a third outer electrode, and a fourth outer electrode on a surface of the insulator; and
a first coil and a second coil each including a plurality of conductor patterns in the insulator; wherein
the first coil includes:
at least two layers of first conductor patterns electrically connected to the first outer electrode; and
a second conductor pattern on the first conductor patterns and electrically connected to the second outer electrode;

the layers of the first conductor patterns are connected in parallel to each other and the second conductor pattern is connected in series to the first conductor patterns;
the second coil includes:
at least two layers of third conductor patterns electrically connected to the third outer electrode; and
a fourth conductor pattern laminated on the third conductor patterns and electrically connected to the fourth outer electrode;
the layers of the third conductor patterns are connected in parallel to each other and the fourth conductor pattern is connected in series to the third conductor patterns;
the first coil and the second coil are positioned in the insulator such that the second conductor pattern and the fourth conductor pattern face each other in a lamination direction of the insulator;
an opening of the first coil overlaps an opening of the second coil when viewed in the lamination direction of the insulator; and
an area of a portion where the second conductor pattern overlaps the fourth conductor pattern is equal to or smaller than about 80% of an area of a portion where at least one of the second conductor pattern and the fourth conductor pattern exists when viewed in the lamination direction of the insulator.

2. The coil element according to claim 1, wherein
the layers of the first conductor patterns are electrically connected to the first outer electrode; and
the layers of the third conductor patterns are electrically connected to the third outer electrode.

3. The coil element according to claim 1, wherein the area of the portion where the second conductor pattern overlaps the fourth conductor pattern is equal to or smaller than about 50% of the area of the portion where the at least one of the second conductor pattern and the fourth conductor pattern exists when viewed in the lamination direction of the insulator.

4. The coil element according to claim 1, wherein the third outer electrode is a ground electrode.

5. The coil element according to claim 4, wherein the third outer electrode does not overlap the first conductor patterns when viewed in the lamination direction of the insulator.

6. The coil element according to claim 1, wherein an interlayer distance between the first conductor patterns adjacent to each other is longer than an interlayer distance between the third conductor patterns adjacent to each other.

7. The coil element according to claim 1, wherein an interlayer distance between the first conductor patterns adjacent to each other is longer than an interlayer distance between the second conductor pattern and the first conductor pattern closest to the second conductor pattern.

8. The coil element according to claim 1, wherein the first coil is positioned such that the opening of the first coil is shifted from a center of the coil element in a long-side direction when viewed in the lamination direction of the insulator.

9. The coil element according to claim 8, wherein the first coil is positioned such that the opening of the first coil is closer, in the long-side direction, to a short side of the coil element on which the second outer electrode is provided when viewed in the lamination direction of the insulator.

10. An antenna device comprising:
a first radiating element connected to a power supply circuit;
a second radiating element; and the coil element according to claim 1 being electrically connected to the first radiating element and the second radiating element; wherein the first radiating element is electrically connected to the first coil of the coil element; and the second radiating element is electrically connected to the second coil of the coil element.

11. The antenna device according to claim 10, wherein the first radiating element is electrically connected to the first outer electrode of the coil element;

the power supply circuit is electrically connected to the second outer electrode of the coil element;

the second radiating element is electrically connected to the fourth outer electrode of the coil element; and the third outer electrode of the coil element is grounded.

12. The antenna device according to claim 11, wherein the power supply circuit is electrically connected to the first outer electrode of the coil element;

the first radiating element is electrically connected to the second outer electrode of the coil element;

the second radiating element is electrically connected to the fourth outer electrode of the coil element; and the third outer electrode of the coil element is grounded.

13. An electronic device comprising:

the antenna device according to claim 10;

the power supply circuit connected to the first radiating element; and a housing in which the antenna device and the power supply circuit are housed.

14. A coil element comprising:

an insulator including a first principal surface, a second principal surface facing the first principal surface, and four side surfaces connecting the first principal surface and the second principal surface;

a first coil and a second coil in the insulator; and outer electrodes respectively provided on a corresponding one of the four side surfaces of the insulator and electrically connected to the first coil and the second coil; wherein the four side surfaces of the insulator includes a first side surface and a second side surface facing the first side surface;

a region of the insulator when viewed from the first principal surface is divided into a first region closer to the first side surface and a second region closer to the second side surface;

a region in which an opening of the first coil overlaps an opening of the second coil is in the first region;

a wire through which the first coil or the second coil is electrically connected to the outer electrode on the second side surface is in the second region; and the first region occupies about two-thirds of the region of the insulator when viewed from the first principal surface.

15. The coil element according to claim 14, wherein the outer electrode on the first side surface and the outer electrode on the second side surface are connected to respective ends of the first coil.

16. The coil element according to claim 14, wherein only the wire through which the first coil or the second coil is connected to the outer electrode exists in the second region.

17. The coil element according to claim 16, wherein only a wiring layer for one layer exists in the second region.

18. The coil element according to claim 14, wherein the insulator has a rectangular or substantially rectangular parallelepiped shape; and the region of the insulator when viewed from the first principal surface has shorter sides that are sides closer to the first side surface and the second side surface.

19. The coil element according to claim 14, wherein the outer electrode on the first side surface is connected to a power supply circuit.

* * * * *